US008862525B2

(12) United States Patent  
Cheng et al.

(10) Patent No.: US 8,862,525 B2  
(45) Date of Patent: Oct. 14, 2014

(54) METHOD FOR SCREENING SAMPLES FOR BUILDING PREDICTION MODEL AND COMPUTER PROGRAM PRODUCT THEREOF

(71) Applicant: National Cheng Kung University, Tainan (TW)

(72) Inventors: Fan-Tien Cheng, Tainan (TW); Wei-Ming Wu, Tainan (TW)

(73) Assignee: National Cheng Kung University, Tainan (TW)

( * ) Notice: Subject to any disclaimer, the term of this patent is extended or adjusted under 35 U.S.C. 154(b) by 172 days.

(21) Appl. No.: 13/667,039

(22) Filed: Nov. 2, 2012

(65) Prior Publication Data

US 2013/0159226 A1    Jun. 20, 2013

(30) Foreign Application Priority Data

Dec. 20, 2011   (TW) .............................. 100147447 A

(51) Int. Cl.  
*G06N 3/08* (2006.01)  
*G01W 1/10* (2006.01)

(52) U.S. Cl.  
CPC . *G06N 3/088* (2013.01); *G01W 1/10* (2013.01)  
USPC .................. 706/12; 706/13; 706/45

(58) Field of Classification Search  
None  
See application file for complete search history.

(56) References Cited

U.S. PATENT DOCUMENTS 7,593,912 B2   9/2009   Cheng et al.  
7,603,328 B2   10/2009  Cheng et al.  
8,095,484 B2   1/2012   Cheng et al.

OTHER PUBLICATIONS

Prieto, et al., Algorithm to find gene expression profiles of deregulation and identify families of disease-altered genes, Bioinformatics, vol. 22, No. 9, 2006, pp. 1103-1110.*  
Yan, Methods of Determining the Number of Clusters in a Data Set and a New Clustering Criterion, Doctoral Thesis, Virginia Polytechnic Institute and State University, 2005, pp. 1-120.*  
A.A. Khan, J.R. Moyne, and D. M. Tilbury, "An Approach for Factory-Wide Control Utilizing Virtual Metrology," IEEE Transactions on Semiconductor Manufacturing, vol. 20, No. 4, pp. 364-375, Nov. 2007.  
A.A. Khan, J.R. Moyne, and D.M. Tilbury, "Virtual Metrology and Feedback Control for Semiconductor Manufacturing Process Using Recursive Partial Least Squares," Journal of Process Control, vol. 18, pp. 961-974, Apr. 2008.  
S. Lynn, J.V. Ringwood, and N. MacGearailt, "Weighted Windowed PLS Models for Virtual Metrology of an Industrial Plasma Etch Process," in IEEE Int. Conf. Indust. Tech., Valpariaso, Chile, pp. 271-276, Mar. 2010.

* cited by examiner

*Primary Examiner* — Wilbert L Starks  
(74) *Attorney, Agent, or Firm* — McClure, Qualey & Rodack, LLP

(57) ABSTRACT

A method for screening samples for building a prediction model and a computer program product thereof are provided. When a set of new sample data is added to a dynamic moving window (DMW), a clustering step is performed with respect to all of the sets of sample data within the window for grouping the sets of sample data with similar properties as one group. If the number of the sets of sample data in the largest group is greater than a predetermined threshold, it means that there are too many sets of sample data with similar properties in the largest group, and the oldest sample data in the largest group can be deleted; if smaller than or equal to a predetermined threshold, it means that the sample data in the largest group are quite unique, and should be kept for building or refreshing the prediction model.

18 Claims, 12 Drawing Sheets

METHOD FOR SCREENING SAMPLES FOR BUILDING PREDICTION MODEL AND COMPUTER PROGRAM PRODUCT THEREOF

RELATED APPLICATIONS

The present application is based on, and claims priority from Taiwan Application Serial Number 100147447, filed Dec. 20, 2011, the disclosure of which is hereby incorporated by reference herein in its entirety.

BACKGROUND

1. Field of Invention

The present invention relates to a method for screening samples for building a prediction model and a computer program product thereof. More particularly, the present invention relates to a method for screening samples for building a prediction model by using a dynamic moving window (DMW) and a computer program product thereof.

2. Description of Related Art

Historical sample data are often used for building a first set of prediction models, and the prediction models are applied in an actual process environment. When a set of sample data is newly collected, a conventional skill uses the newly-collected sample data for model refreshing, so as to refresh or retrain the prediction models. Therefore, the prediction accuracy of the prediction models is closely related to the historical sample data and the new sample data collected during an on-line model-refreshing phase.

In an example of building a virtual metrology (VM) model, a process tool will confront the events such as equipment preventive maintenance, equipment drift or design of experiments (DOE) required for equipment feature tests or calibration. If important sample data can be collected for the aforementioned events, the data features contained in the CM model will be more complete, thereby promoting the accuracy and stability of real-time conjecturing product quality by virtual metrology. Typically, a conventional skill adopts a static moving window (SMW) scheme to keep and administer sample data for model building. The so-called "SMW" scheme uses a set of sample data newly entering a window to replace the oldest sample data in the window with a fixed total number of sample data. Thus, with the advance of time, the sample data at the front end of the window will be gradually replaced by the sample data subsequently entering the window, such that the important sample data related to the aforementioned events will be discarded out of the model-building samples. Therefore, when a similar equipment drift event occurs again, the prediction model (VM model) will fail to accurately conjecture such an equipment drift event.

Hence, there is a need to provide a method for screening samples for building a prediction model and a computer program product thereof for obtaining and keeping enough important model-building sample data to overcome the aforementioned disadvantages of the conventional skill.

SUMMARY

An object of the present invention is to provide a method for screening samples for building a prediction model and a computer program product thereof for obtaining and keeping enough important model-building sample data, thereby assuring the prediction accuracy of the prediction model.

According to an aspect of the present invention, a method for screening samples for building a prediction model is provided. In this method, at first, a plurality of sets of first sample data sequentially generated with respect to a target to be predicted are obtained, wherein the sets of first sample data include a plurality of sets of monitored data, and a plurality of objective data, wherein the objective data are corresponding to the sets of monitored data in a one-to-one manner and are cause-and-result related. Then, a clustering step is performed with respect to all of the sets of first sample data for grouping the sets of first sample data with high similarities as one group, thereby forming and obtaining a plurality of first groups. Thereafter, a step is performed for searching for at least one of the first groups having the most number of sets of first sample data, thereby obtaining at least one second group. Then, a step is performed for determining if the number of the at least one second group is greater than or equal to 2, thus obtaining a first determination result. When the first determination result is yes, a step is performed for searching for one of the at least one second group having the oldest set of first sample data, thereby obtaining a third group, and then a step is performed for determining if the number of sets of first data in the third group is smaller than a predetermined number (for example, 3), thus obtaining a second determination result. When the first determination result is no, a step is performed for determining if the number of sets of first data in the second group is smaller than the predetermined number, thus obtaining a third determination result. When the second determination result or the third determination result is yes, all of the sets of first sample data are reserved for building or refreshing the prediction model, wherein the prediction model is used for predicting a status or behavior of the target. When the second determination result is no, the oldest set of first sample data in the third group is discarded and the remaining sets of first sample data are reserved for building or refreshing the prediction model. When the third determination result is no, the oldest set of first sample data in the second group is discarded and the remaining sets of first sample data are reserved for building or refreshing the prediction model.

In one embodiment, the sets of first sample data include a plurality of sets of historical sample data stored in a database, and a set of newly-collected sample data.

In another embodiment, the sets of first sample data are obtained via a moving window.

In another embodiment, the target to be predicted is a workpiece processed by a process tool, and the prediction model is a virtual metrology model. The sets of monitored data are a plurality of sets of process data which are generated while a plurality of historical workpieces are processed in the process tool, each of the sets of process data including a plurality of process parameters. The objective data are a plurality of metrology data which are obtained by using a metrology tool to measure the historical workpieces, wherein the metrology data are corresponding to the sets of process data in a one-to-one manner.

In another embodiment, the clustering step is performed in accordance with an adaptive resonance theory 2 (ART2) algorithm, a Euclidean distance (ED) algorithm or a weighted Euclidean Distance (WED) algorithm.

In another embodiment, the clustering step is performed with respect to the sets of sets of monitored data in the sets of first sample data.

In another embodiment, the clustering step is performed with respect to the sets of sets of monitored data and the objective data in the sets of first sample data.

According to an aspect of the present invention, a computer program product stored on a non-transitory tangible computer readable recording medium is provided. When the computer program product is loaded and executed by a computer, the aforementioned method is performed for screening samples for building a prediction model.

Hence, with the application of the embodiments of the present invention, enough important model-building sample data can be obtained and kept, and thus the prediction accuracy of the prediction model can be assured.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
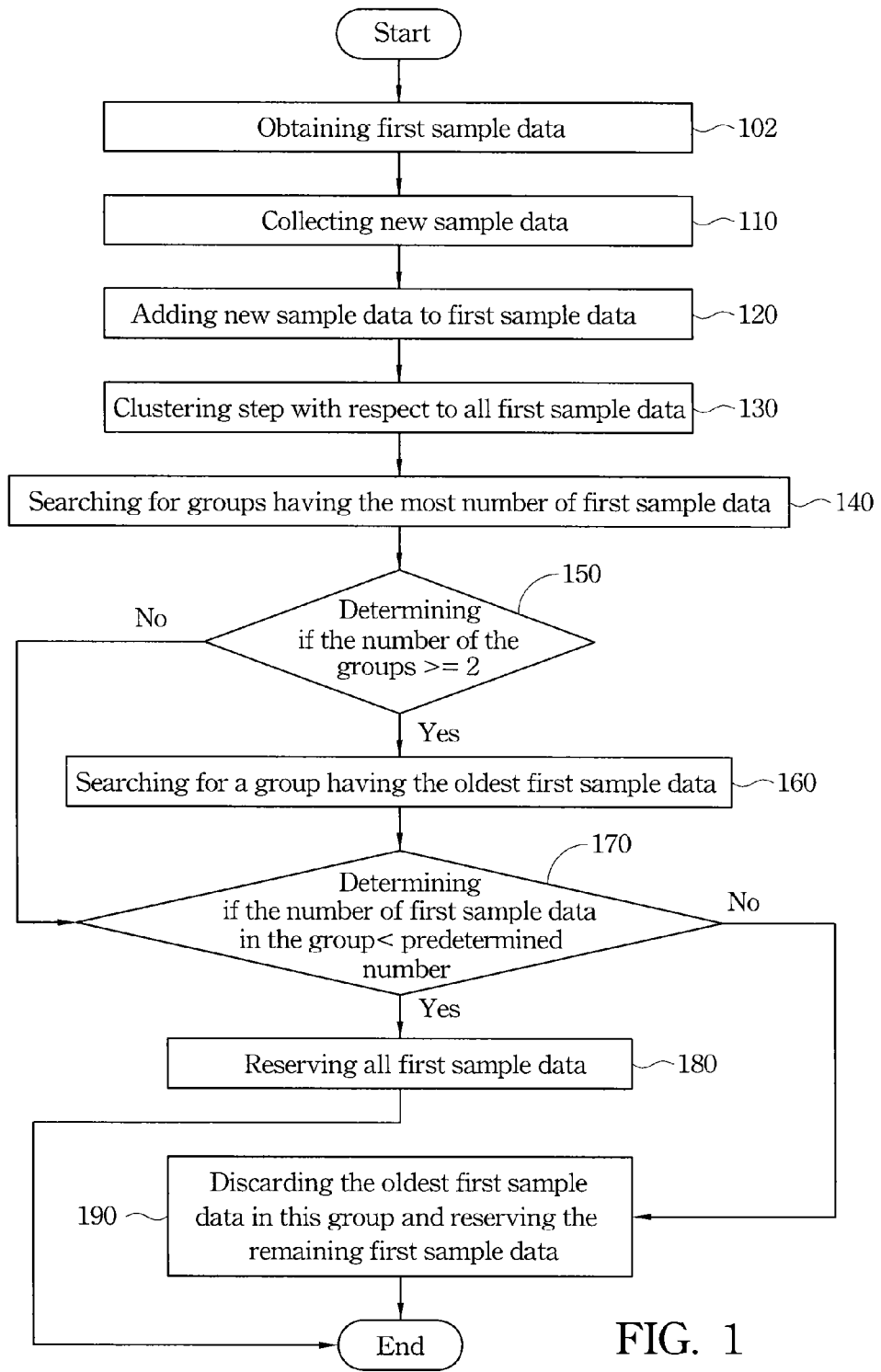
FIG. 1 is a flow chart showing a method for screening samples for building a prediction model according to an embodiment of the present invention.

Reference will now be made in detail to the embodiments of the present invention, examples of which are illustrated in the accompanying drawings. Wherever possible, the same reference numbers are used in the drawings and the description to refer to the same or like parts.

The present invention provides a method for screening samples for building or refreshing a prediction model used to predict a status or behavior of a target to be predicted. The present invention is applicable to the prediction model such as, in a high tech industry, a VM model, a yield prediction model, a preventive maintenance model, a production prediction model, etc.; in a 3D image technology of healthcare industry, a prediction model of caner proliferation rate, etc.; in a weather forecast industry, a prediction model of typhoon's movement path, a prediction model of rainfall, a prediction model of mud flow warning, etc.

The present invention mainly provides a dynamic moving window (DMW) to keep and administer samples. When a set of new ample data is added to the DMW, a clustering technique is used to grouping all the samples existing in the window, such that the samples with similar properties are classified in the same group. Then, the number of each group is inspected. If the number of the largest group is greater than a predetermined threshold, it means that the largest group has many sets of sample data with similar properties, and thus the oldest set of sample data in the largest group can be discarded. If the number of the largest group is smaller than or equal to the predetermined threshold, it means that the sets of sample data in the largest group are quite unique and have to be reserved for building or refreshing the prediction model to predict special behaviors of the target to be predicted. In other words, the present invention can real-time absorbs important information (sample) related to the variance of the target, and the important sample will not be discarded due to a time factor, and the prediction model also can predict the product quality correctly if confronting the target variance which has occurred in the past.

Referring to FIG. 1, FIG. 1 is a flow chart showing a method for screening samples for building a prediction model according to an embodiment of the present invention. As shown in FIG. 1, at first, step 102 is performed for obtaining a plurality of sets of first sample data. At this point, the sets of first sample data are a plurality of sets of historical sample data sequentially generated with respect to a target to be predicted, and may be stored in a database, for example. The sets of first sample data include a plurality of sets of monitored data, and a plurality of objective data, wherein the objective data are corresponding to the sets of monitored data in a one-to-one manner and are cause-and-result related. For example, the target to be predicted is a workpiece (such as a wafer in a semiconductor factory; or a glass substrate in a TFT-LCD factory) processed by a process tool, and the prediction model is a virtual metrology model. The sets of monitored data are a plurality of sets of process data which are generated while a plurality of historical workpieces are processed in the process tool, and each of the sets of process data includes a plurality of process parameters. The objective data are a plurality of metrology data which are obtained by using a metrology tool to measure the historical workpieces, wherein the metrology data are corresponding to the sets of process data in a one-to-one manner.

Thereafter, step 110 is performed for collecting a new set of sample data regarding the aforementioned target to be predicted, wherein the new set of sample data is related to a workpiece which is processed after the historical workpieces, i.e., is generated after the historical sample data. Then, step 120 is performed for adding the new set of sample data collected to the sets of first sample data (historical sample data), and thus the sets of first sample data now include the sets of historical sample data and the new set of sample data. It is noted that the present embodiment may process the historical data directly, i.e. skip steps 110 and 120.

Thereafter, a clustering step 130 is performed with respect to all of the sets of first sample data for grouping the sets of first sample data with high similarities as one group, thereby forming and obtaining a plurality of first groups. In the present embodiment, the clustering step may be performed only with respect to the sets of sets of monitored data in the sets of first sample data. However, since different monitored data (such as process data) may lead to the same objective data (such as metrology data). Therefore, the clustering step is performed preferably with respect to the sets of sets of monitored data and the objective data in the sets of first sample data. The clustering step of the present embodiment may use any clustering algorithm, such as an adaptive theory 2 (ART2) algorithm, a Euclidean distance (ED) algorithm, or a weighted Euclidean Distance (WED) algorithm, wherein the WED algorithm is one of the features of the present embodiment, and will be described in detail later. The other clustering algorithms are well kin to those skilled in the art, and are described again herein.

Then, step 140 is performed for searching for at least one of the first groups having the most number of sets of first sample data, thereby obtaining at least one second group. Thereafter, step 150 is performed for determining if the number of the at least one second group is greater than or equal to 2. If the result of step 150 is yes, it means that there are two or more second groups (having the most number of sets of first sample data), and then step 160 is performed for searching for one of the at least one second group having the oldest set of first sample data, thereby obtaining a third group, and then step 170 is performed for determining if the number of sets of first sample data in the third group is smaller than a predetermined number (for example, 3), thus obtaining a second determination result. If the result of step 150 is no, step 170 is directly performed. If the result of step 170 is yes, it means that there are too few samples existing in the first group having the most number of sets of first sample data, and thus all of the first sample data in this group are quite unique, such that step 180 is performed for reserving all of the sets of first sample data used in step 130 for building or refreshing the prediction model, wherein the prediction model is used for predicting a status or behavior of the target. If the result of step 170 is no, it means that there are quite many samples existing in the first group having the most number of sets of first sample data, and thus step 190 is performed for discarding the oldest set of first sample data in this group and reserving the remaining sets of first sample data for building or refreshing the prediction model, thereby saving the time for model building or refreshing.

Hereinafter, an example of using a WED algorithm and a VM model is used for explaining the aforementioned clustering step, wherein each set of first sample data includes a set of process data and a measurement datum corresponding to the set of process data, and each set of process data includes a plurality of process parameters.

In the clustering step 130, at first, the weighted correlation coefficient $W_j$ between the jth process parameter $X_j$, j=1, 2, ..., p, and its corresponding actual measurement value (real metrology) y is calculated in accordance with equation (1).

$$W_j = \frac{r(X_j, y)}{\sum_{j=1}^{p} r(X_j, y)}, j = 1, 2, \ldots, p \quad (1)$$

where $r(X_j, y)$ is a correlation coefficient between the jth process parameter $X_j$, and the actual measurement value y, with $X_j=[x_{1,j}, x_{2,j}, \ldots, x_{n,j}]^T$ being the j set of individual parameter containing n modeling samples, and $y=[y_1, y_2, \ldots, y_n]^T$ the corresponding set of actual measurement values of n modeling samples. As a result, the weighted-correlation-coefficient matrix (W) can be expressed as:

$$W = \begin{bmatrix} W_1 & 0 & \cdots & 0 \\ 0 & W_2 & \cdots & 0 \\ \vdots & \vdots & \ddots & \vdots \\ 0 & 0 & \cdots & W_p \end{bmatrix} \quad (2)$$

-continued $$= \begin{bmatrix} \frac{r(X_1, y)}{\sum_{j=1}^{p} r(X_j, y)} & 0 & \cdots & 0 \\ 0 & \frac{r(X_2, y)}{\sum_{j=1}^{p} r(X_j, y)} & \cdots & 0 \\ \vdots & \vdots & \ddots & \vdots \\ 0 & 0 & \cdots & \frac{r(X_p, y)}{\sum_{j=1}^{p} r(X_j, y)} \end{bmatrix}$$

where
$x_{1,j}$ is the jth process parameter in the ith set of process data,
$y_i$ is the ith actual measurement value,
i represents the ith sample, i=1, 2, ..., n, and
j represents the jth parameter, j=1, 2, ..., p.

Then, a weighted Euclidean distance $WED_i$ (i=1, 2, ..., n) is calculated for each set of sample data. Before the $WED_i$ is constructed, the process data (monitored data) have to be standardized. The equations for standardizing the process data are $$Z_{x_{i,j}} = \frac{x_{i,j} - \bar{x}_j}{\sigma_{x_j}}, i = 1, 2, \ldots, n; j = 1, 2, \ldots, p \quad (3)$$

$$\bar{x}_j = \frac{1}{n}(x_{1,j} + x_{2,j} + \ldots + x_{n,j}) \quad (4)$$

$$\sigma_{x_j} = \sqrt{\frac{1}{n-1}[(x_{1,j} - \bar{x}_j)^2 + (x_{2,j} - \bar{x}_j)^2 + \ldots + (x_{n,j} - \bar{x}_j)^2]} \quad (5)$$

where $Z_{x_{i,j}}$ is the standardized jth process parameter in the ith set of process data; $\bar{x}_j$ is the mean of the jth process parameter; and $\sigma_{x_j}$ is the standard deviation of the jth process parameter.

Let $Z_i=[Z_{x_{i,1}}, Z_{x_{i,2}}, \ldots, Z_{x_{i,p}}]^T$ be the vector of the ith set of standardized process data. And, the model set of the process parameters is defined as $X_M=[x_{M,1}, x_{M,2}, \ldots, x_{M,p}]^T$, where $x_{M,j}$ equals to $\bar{x}_j$, j=1, 2, ..., p, such that each element in the model set after standardization (also denoted as the standardized model parameter $Z_{M,j}$) has a value of 0. Restated, all of the elements in $Z_M=[Z_{M,1}, Z_{M,2}, \ldots, Z_{M,p}]^T$ are 0.

Thereafter, the $WED_i$ is expressed as:

$$WED_i=(Z_i-Z_M)WIW^T(Z_i-Z_M)^T \quad (6)$$

where I is the identity matrix. Due to all of the elements in $Z_M$ are 0, the $WED_i$ can be simplified as $$WED_i=Z_iWIW^TZ_i^T \quad (7)$$

After all of the $WED_i$ (i=1, 2, ..., n), are obtained, they are first plotted as a histogram. Then, the Sturge's rule is applied to calculate the desired number (C) of clusters. The Sturge's rule is $$\text{Group Number}=1+\log_2(n) \quad (8)$$

where n is the number of samples for modeling. The nearest integer of Group Number in (8) is adopted as the C value. Finally, those $WED_i$, i=1, 2, ..., n, are equally divided into C clusters with $$\text{Width of a Cluster}=[\max(WED_i)-\min(WED_i)]/C \quad (9)$$

where $\max(WED_i)$ represents the maximum $WED_i$; and the $\min(WED_i)$ represents the minimum $WED_i$.

Figure 2:
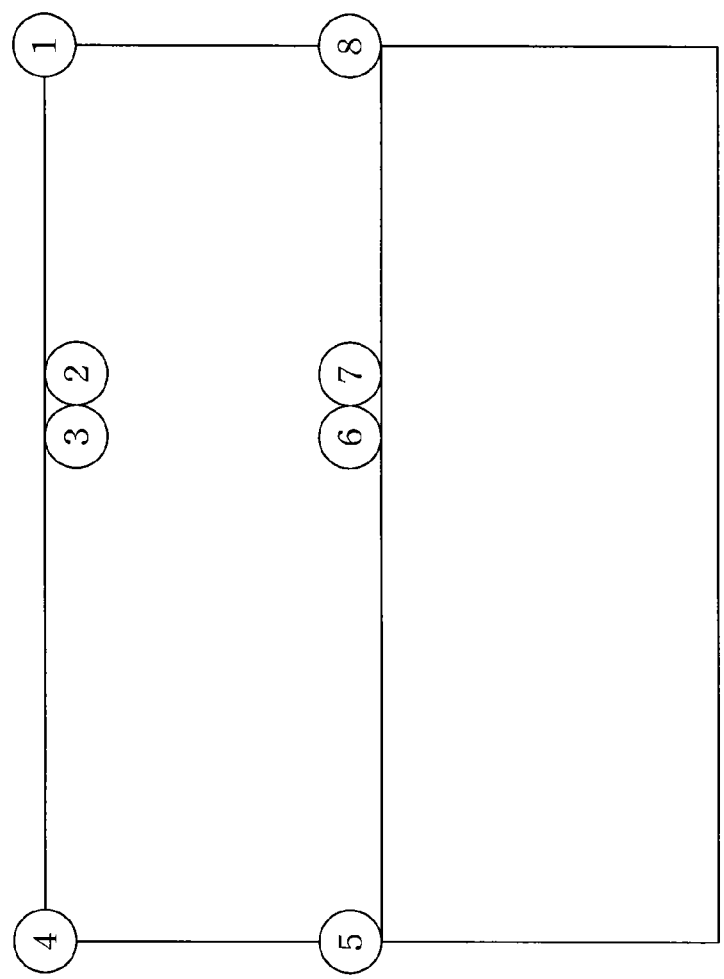
FIG. 2 is a schematic diagram for illustrating measurement positions on a glass substrate (target to be predicted) shown in examples.

Hereinafter, two examples are used to explain the advantages of the DMW of the present invention, wherein all of the experimental data are collected from a photo tool which is practically operated in a fifth-generation TFT-LCD factory. Referring to FIG. 2, FIG. 2 is a schematic diagram for illustrating measurement positions on a glass substrate (target to be predicted) shown in examples. As shown in FIG. 2, measurement positions 1-8 are measured in those two examples. According to the physical properties of the photo tool, 21 key process parameters are chosen respectively as inputs of the VM model (prediction model). The process data are extracted from time-series-trace data by taking averages of a window of time period.

A global similarity index (GSI) used in those two examples can be referred to U.S. Pat. No. 7,593,912 entitled "Method for evaluating reliance level of a virtual metrology system in product manufacturing", which is incorporated herein by reference. The GSI is used for evaluating the similarity between any set of sample data newly entering the window and all of the process data (historical sample data). If the GSI calculated is small, it means that the newly-entering sample data is similar to the sample data for model-building. Otherwise, if the GSI is too great, it means that newly-entering sample data is different from the sample data for model-building.

The GSI and VM model used in those two examples can be referred to U.S. Pat. No. 7,603,328 entitled "Dual-phase virtual metrology method"; and U.S. Pat. No. 8,095,484 entitled "System and Method for Automatic Virtual Metrology", which are incorporated herein by reference. It is noted that U.S. Pat. No. 7,593,912, U.S. Pat. No. 7,603,328 and U.S. Pat. No. 8,095,484 all have the same assignee as this application.

The conjecture accuracy of the VM model is quantified by the mean absolute percentage error (MAPE). Its formula is represented as follows:

$$MAPE = \frac{\sum_{i=1}^{q} |(\hat{y}_i - y_i)/y|}{q} \times 100\% \qquad (10)$$

where $\hat{y}_i$ is the VM conjecture value, $y_i$ is the actual measurement value, y is the target value, and q is the conjecture sample size. The closer the MAPE value is to zero, the better the conjecture accuracy of the model would be.

Example 1

Figure 3A:
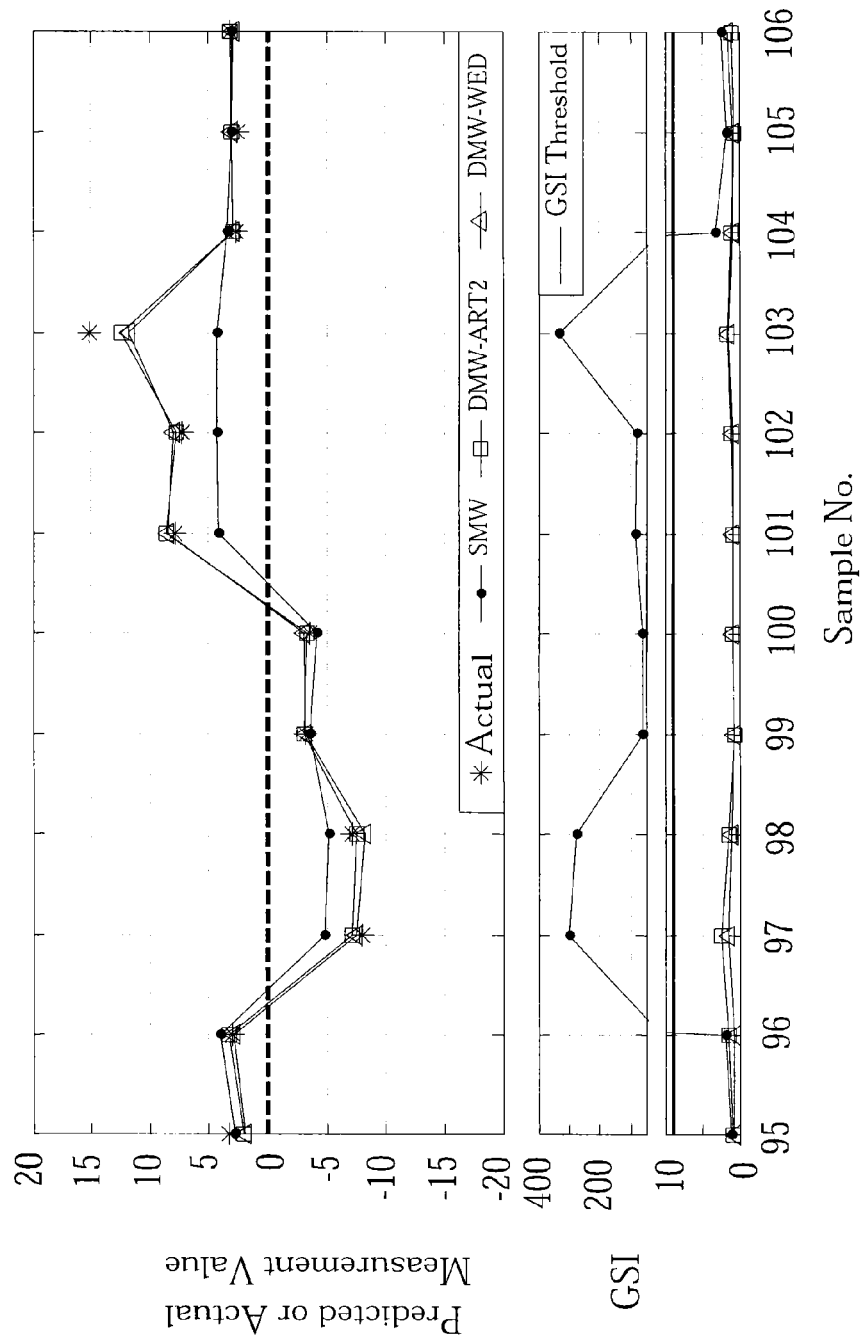
FIG. 3A illustrates predicted and actual measurement values of position 2 on the glass substrate and their corresponding GSI (global similarity index) values according to Example 1.
Figure 3B:
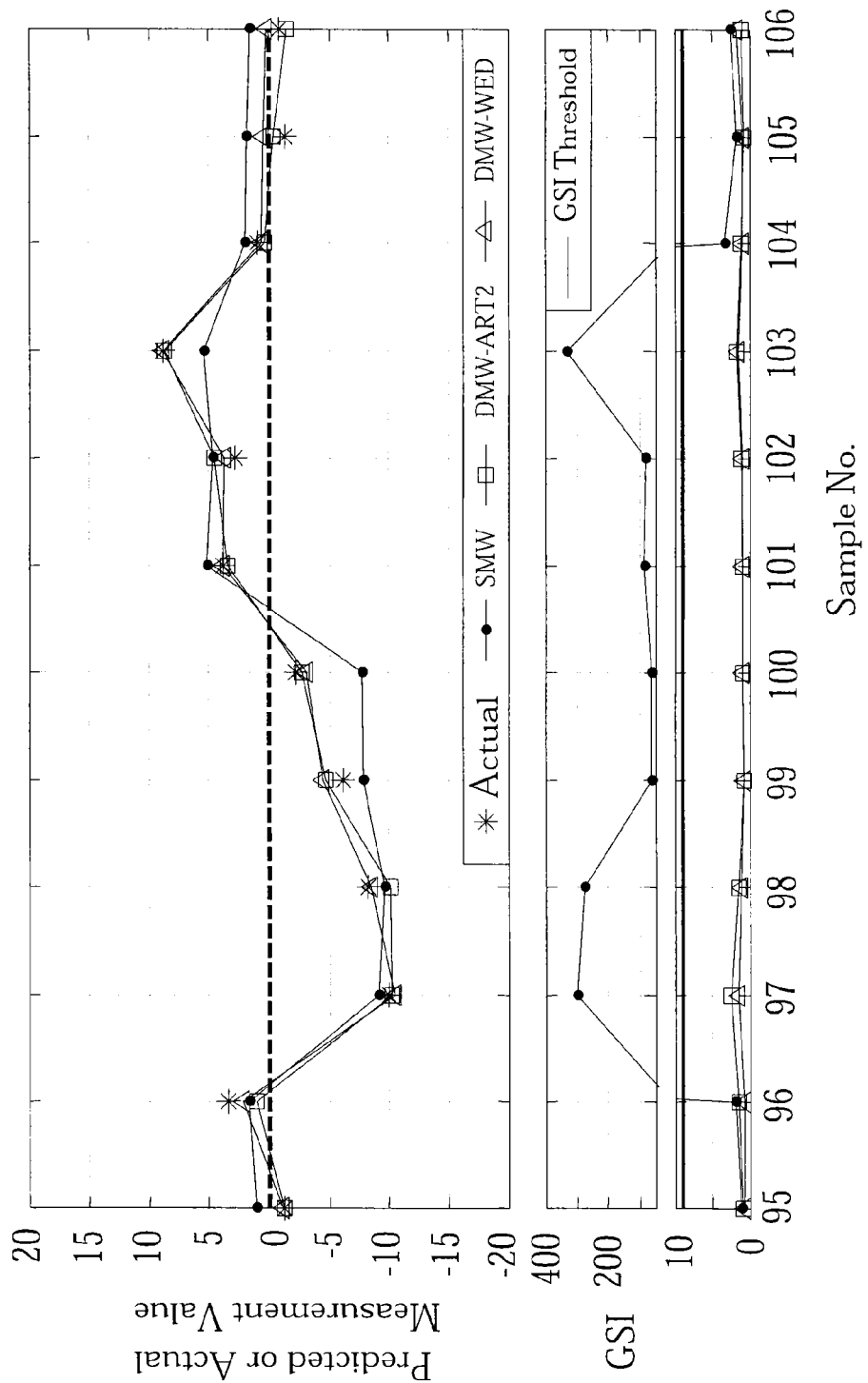
FIG. 3B illustrates predicted and actual measurement values of position 8 on the glass substrate and their corresponding GSI (global similarity index) values according to Example 1.
Figure 4A:
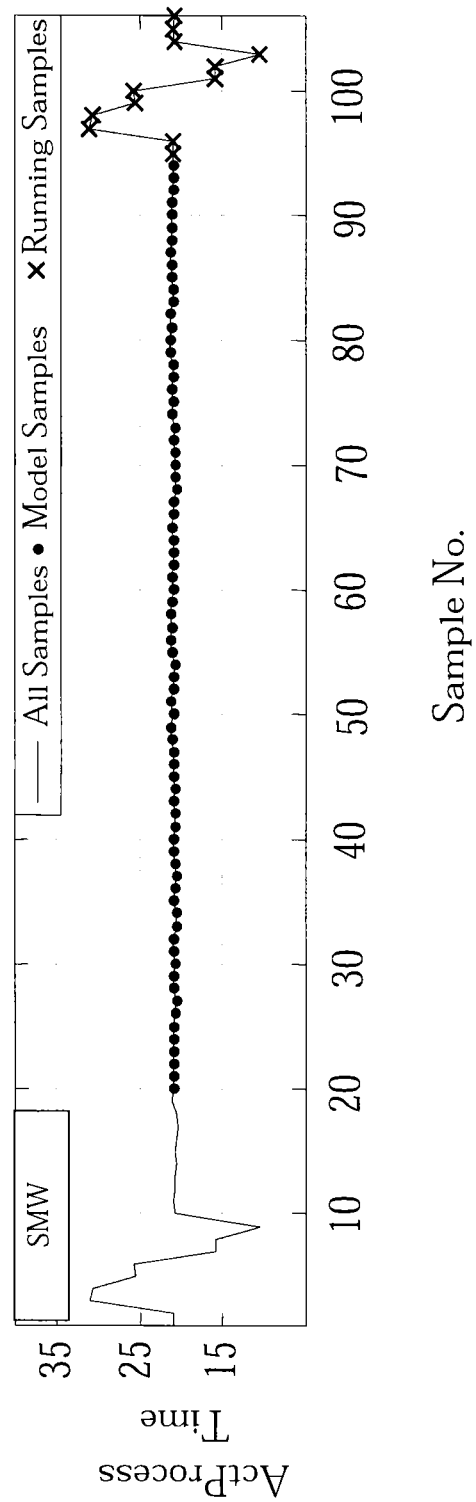
FIG. 4A to FIG. 4C are the respective results of screened samples regarding a main process parameter according to Example 1 in which a conventional SMW, DMW-ART2 and DMW-WED of the present invention are respectively used for screening samples.
Figure 4B:
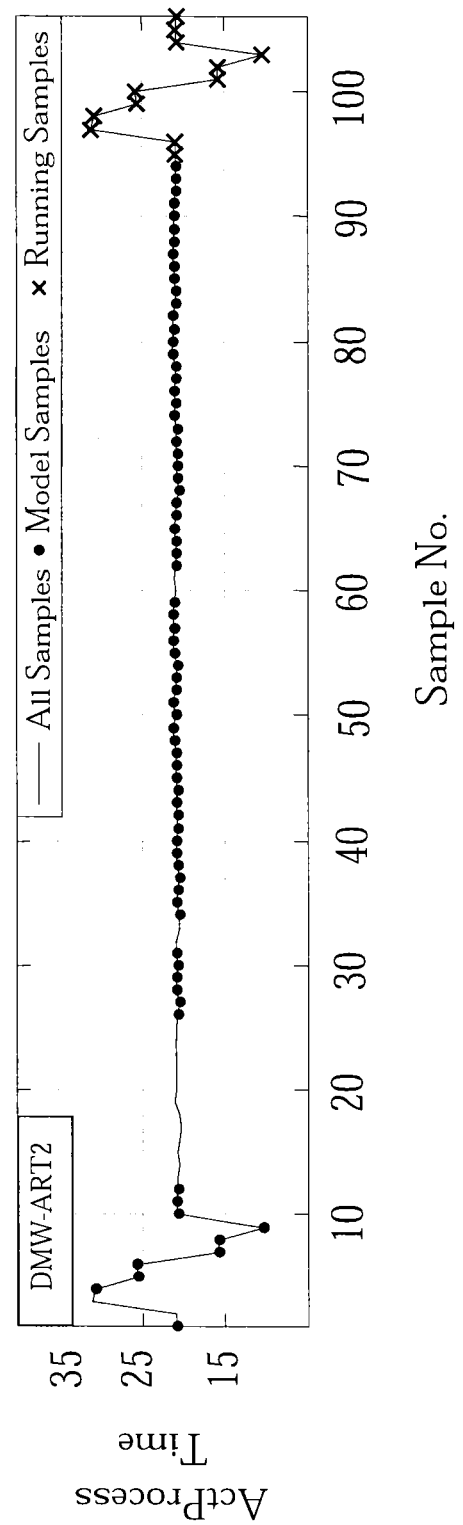
Figure 4C:
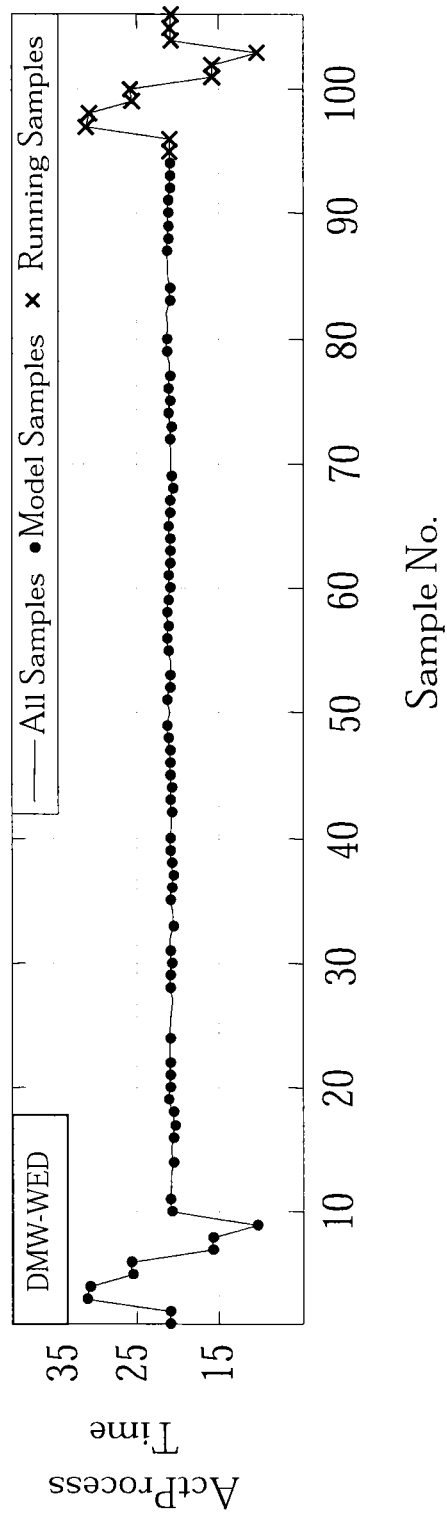

Referring to FIG. 2, FIG. 3A and FIG. 3B, FIG. 3A illustrates predicted and actual measurement values of position 2 on the glass substrate and their corresponding GSI (global similarity index) values according to Example 1; and FIG. 3B illustrates predicted and actual measurement values of position 8 on the glass substrate and their corresponding GSI (global similarity index) values according to Example 2, in which SMW represents the prediction result of using a conventional static moving window to screen samples for building the VM model; DMW-ART2 represents the prediction result of using a dynamic moving window of the present invention based on the ART2 algorithm to screen samples for building the VM model; and DMW-WED represents the prediction result of using a dynamic moving window of the present invention based on the WED algorithm to screen samples for building the VM model. Also referring to FIG. 4A to FIG. 4C, FIG. 4A to FIG. 4C are the respective results of screened samples regarding a main process parameter (Act-Process Time) according to Example 1 in which the conventional SMW, DMW-ART2 and DMW-WED of the present invention are respectively used for screening samples.

The purpose of Example 1 is to demonstrate the DMW's capability of keeping the golden samples that should be kept in the model permanently. To begin with, 12 experimental sets (samples #1-#12) are adopted. Among these 12 sets, samples #3-#9 are especially chosen to perform a critical-dimension (CD) spread test with the adjustment of a major parameter (ActProcess Time) on the photo tool. These seven spread-test samples are the so-called golden samples. Then, 63 additional historical samples are collected. As a result, 75 sets of sample data, which include 12 experimental sets in the front and 63 historical samples at the rear, are adopted as modeling sets to establish the VM conjecture model (prediction model). The following 19 sets of sample data are utilized to tune/re-train (refresh) the VM model, and then the process data of the 12 experimental sets (which contains the golden samples) are used again as the samples for the free-running mode VM conjecturing test, whereas the corresponding actual measurement values (for CD) of those 12 experimental sets are adopted for evaluating the VM conjecture accuracy by using SMW, DMW-ART2 and DMW-WED respectively.

Table I presents the VM conjecture results for all the measurement positions (1-8) shown in FIG. 2 by respectively using SMW, DMW-ART2 and DMW-WED schemes, in which a multi-regression (MR) algorithm and a neural network (NN) algorithm are applied respectively. Among those 8 positions, the conjecture results of Positions 2 and 8 for various schemes are depicted in FIG. 3A and FIG. 3B.

TABLE 1

| | NN | | | | | | MR | | | | | |
|---|---|---|---|---|---|---|---|---|---|---|---|---|
| | MAPE (%) | | | Max Error (%) | | | MAPE (%) | | | Max Error (%) | | |
| Pos. | SMW | DMW-ART2 | DMW-WED | SMW | DMW-ART2 | DMW-WED | SMW | DMW-ART2 | DMW-WED | SMW | DMW-ART2 | DMW-WED |
| 1 | 1.68 | 0.23 | 0.31 | 5.91 | 0.41 | 0.70 | 2.06 | 0.46 | 0.43 | 4.25 | 0.97 | 0.98 |
| 2 | 1.08 | 0.33 | 0.37 | 5.29 | 1.34 | 1.65 | 0.92 | 0.29 | 0.32 | 2.85 | 0.61 | 0.68 |
| 3 | 2.18 | 0.34 | 0.38 | 7.42 | 1.36 | 1.51 | 1.39 | 0.30 | 0.32 | 3.90 | 0.62 | 0.64 |
| 4 | 1.24 | 0.41 | 0.32 | 3.32 | 1.15 | 0.76 | 1.09 | 0.40 | 0.40 | 2.50 | 1.04 | 1.04 |
| 5 | 0.84 | 0.30 | 0.43 | 3.11 | 0.72 | 1.04 | 2.27 | 0.46 | 0.46 | 4.86 | 0.93 | 1.42 |
| 6 | 1.62 | 0.38 | 0.43 | 3.26 | 1.14 | 0.98 | 3.92 | 0.44 | 0.49 | 9.35 | 1.28 | 1.21 |
| 7 | 0.74 | 0.52 | 0.30 | 2.09 | 0.97 | 0.50 | 2.89 | 0.34 | 0.41 | 7.60 | 0.76 | 0.80 |
| 8 | 1.09 | 0.44 | 0.35 | 2.69 | 1.13 | 0.88 | 6.32 | 0.52 | 0.47 | 15.12 | 0.92 | 0.98 |
| Mean | 1.31 | 0.37 | 0.36 | 4.14 | 1.03 | 1.00 | 2.61 | 0.40 | 0.41 | 6.30 | 0.89 | 0.97 |

As shown FIG. 3A and FIG. 3B, the GSI values of the SMW scheme at samples #97-#103 are much higher than the GSI threshold, while, those of the ART2-based DMW and WED-based DMW schemes at samples #97~#103 are both lower than the GSI threshold. In fact, Samples #97-#103 are the aforementioned golden samples (samples #3-#9). This phenomenon indicates that those golden samples have been deleted by the SMW scheme and are still kept by both the ART2-based DMW and WED-based DMW schemes. As shown in Table 1, due to the fact that the golden samples are discarded in the SMW case but preserved in both DWM-ART2 and DMW-WED cases, the MAPEs and Max Errors of the SMW scheme are relatively larger than those of the DWM schemes.

Further, as shown in FIG. 4A to FIG. 4C, after refreshing the VM model by using 19 samples, all of the golden samples are discarded by the SMW scheme; golden samples #4~#9 are still kept by the ART2-based DMW, and all of the golden samples #3~#9 are still kept by the WED-based DMW scheme.

Example 2

Figure 5A:
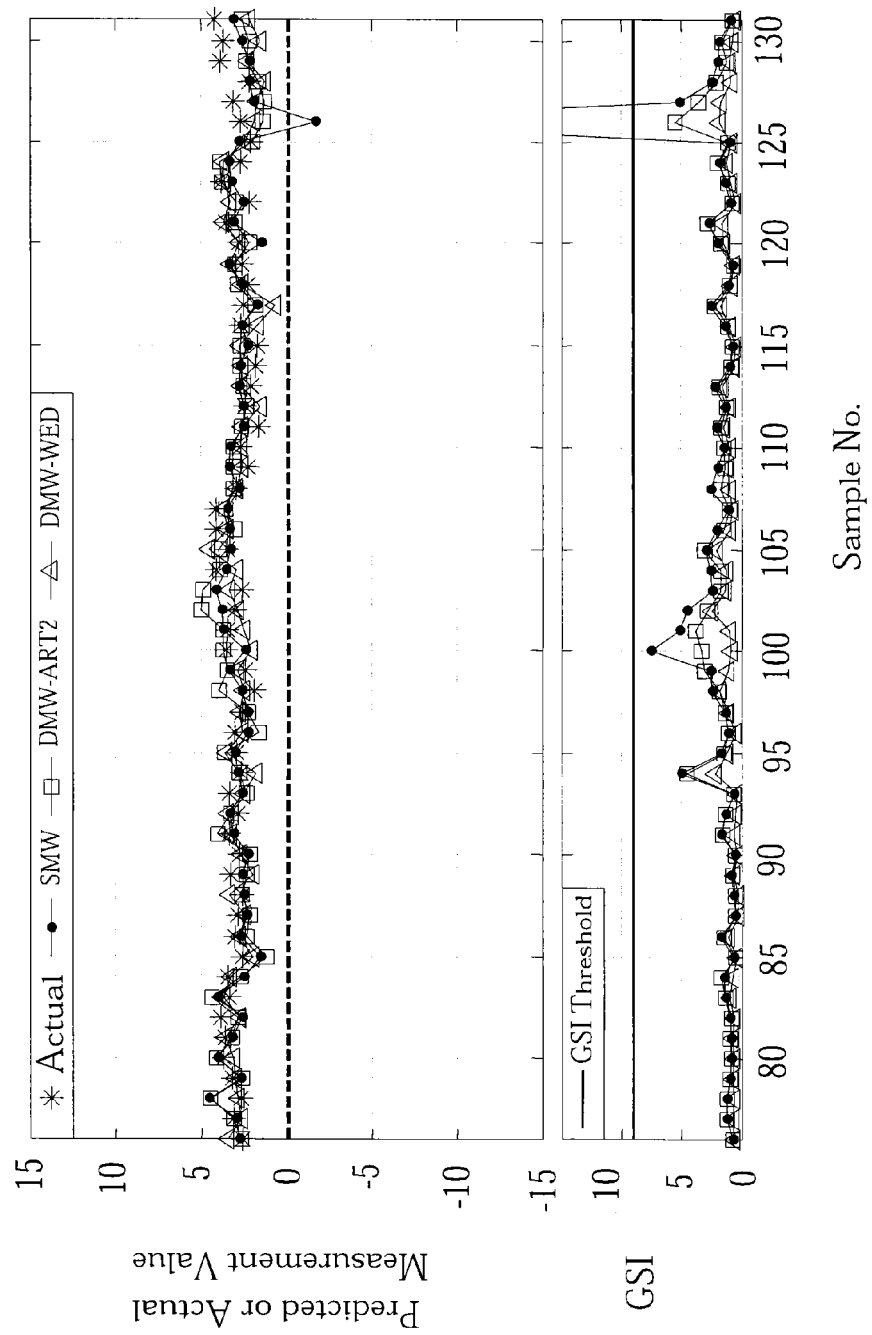
FIG. 5A illustrates predicted and actual measurement values of position 2 on the glass substrate and their corresponding GSI values according to Example 2.
Figure 5B:
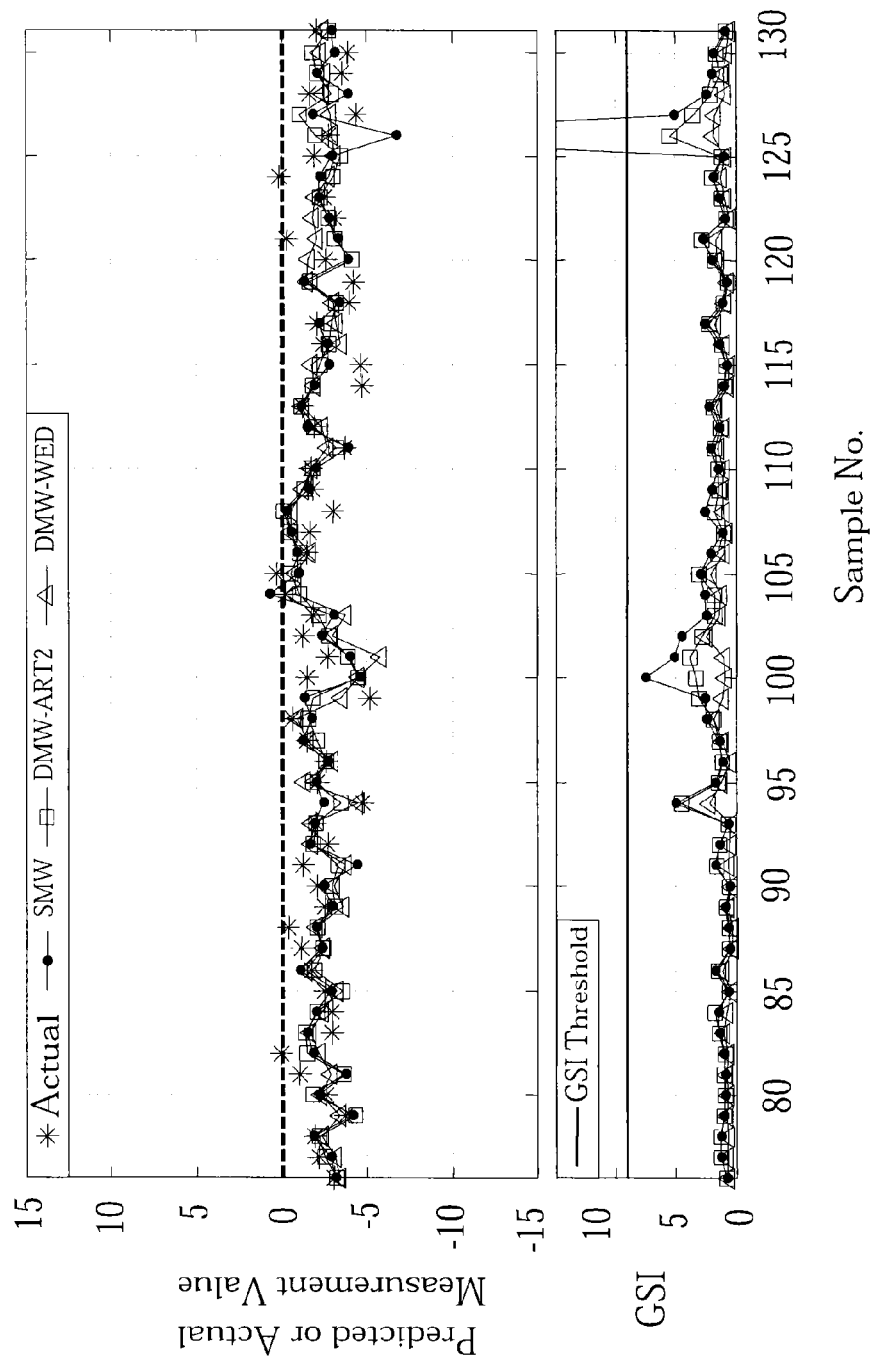
FIG. 5B illustrates predicted and actual measurement values of position 6 on the glass substrate and their corresponding GSI values according to Example 2.

Referring to FIG. 5A and FIG. 5B, FIG. 5A illustrates predicted and actual measurement values of position 2 on the glass substrate and their corresponding GSI values according to Example 2; FIG. 5B illustrates predicted and actual measurement values of position 6 on the glass substrate and their corresponding GSI values according to Example 2. Also referring to FIG. 6A to FIG. 6C, FIG. 6A to FIG. 6C are the respective results of screened samples regarding a main process parameter (Lamp Illumination) according to Example 2 in which a conventional SMW, DMW-ART2 and DMW-WED of the present invention are respectively used for screening samples.

The purpose of Example 2 is to evaluate the performance of SMW, DMW-ART2 and DMW-WED schemes for an ordinary running case by applying a dual-phase VM model (as disclosed in U.S. Pat. No. 7,603,328). In this example, 75 historical samples are collected and adopted as modeling sets to establish the dual-phase VM model. The following 56 sets of sample data are utilized to test and tune/re-train (refresh) the dual-phase VM model. The corresponding actual measurements values (for CD) of those 56 samples are used to evaluate the conjecture accuracy of the VM model.

Table 2 presents the VM conjecture accuracy of various schemes for all the measurement positions (1-8). Among those 8 positions, the conjecture results of Positions 2 and 6 for various schemes are displayed in FIG. 5A and FIG. 5B.

Figure 6A:
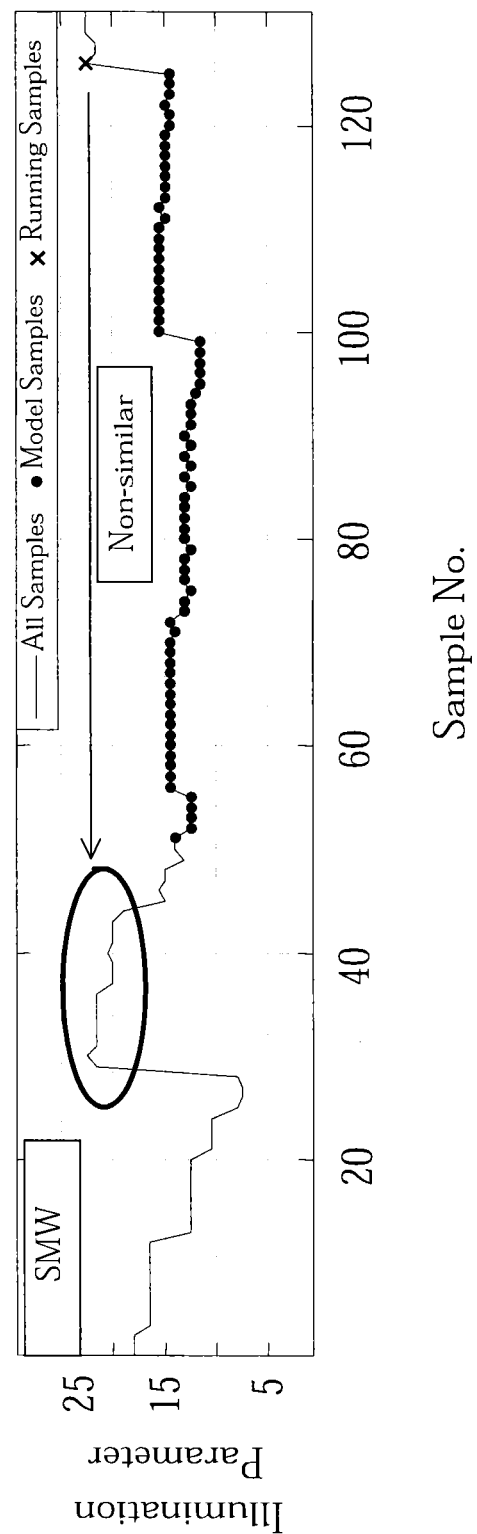
FIG. 6A to FIG. 6C are the respective results of screened samples regarding a main process parameter according to Example 2 in which a conventional SMW, DMW-ART2 and DMW-WED of the present invention are respectively used for screening samples.
Figure 6B:
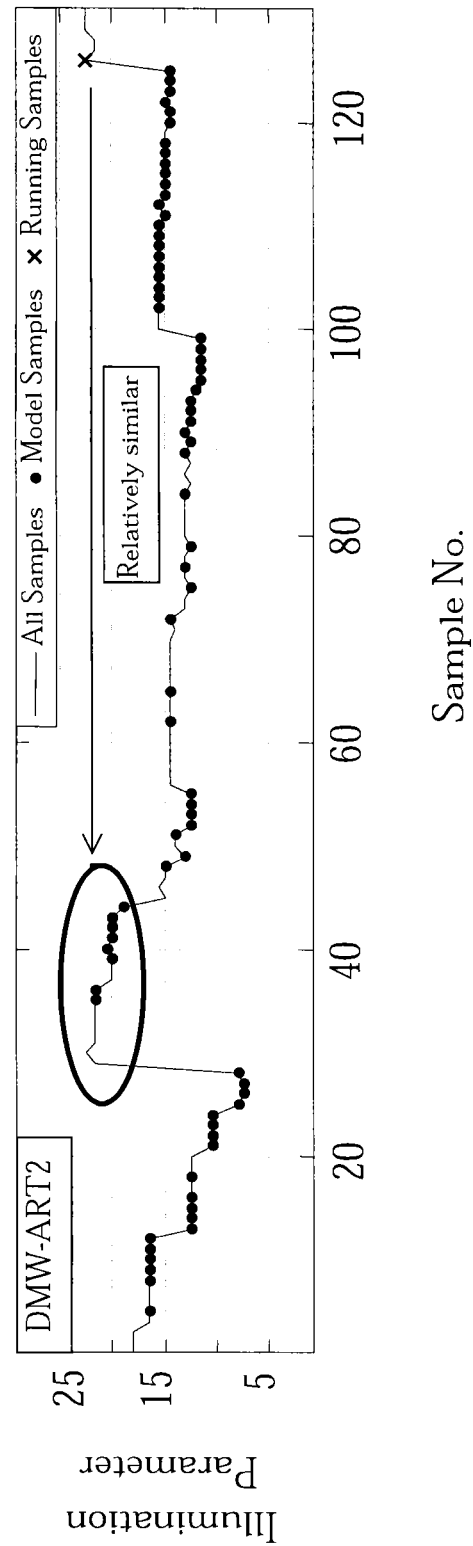
Figure 6C:
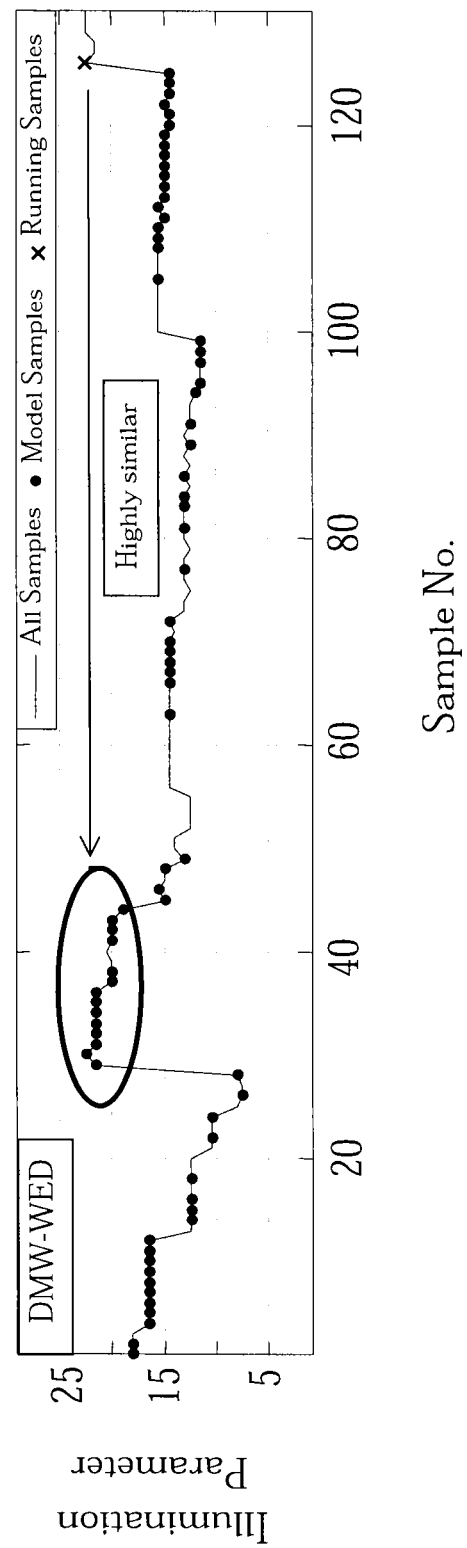

Moreover, a process datum (Lamp Illumination) of Example 2 for all of the 131 samples is depicted in FIG. 6A to FIG. 6C.

As shown in Table 2, the mean MAPEs and Max Errors of the SMW scheme are worse than those of the ART2-based DMW and WED-based DMW schemes, respectively. Comparing the accuracy of the ART2-based DMW with that of the WED-based DMW, the WED-based DMW is slightly better.

As shown in FIG. 5A and FIG. 5B, the GSI value of the SMW scheme at sample #126 is much higher than the GSI threshold (9); while, those of the ART2-based DMW and WED-based DMW schemes at sample #126 are both lower than the GSI threshold. Further, the GSI value of the ART2-based DMW is slightly higher than that of the WED-based DMW at sample #126. As a result, the prediction error of the SMW at sample #126 is larger than those of the ART2-based DMW and WED-based DMW at sample #126. Moreover, the prediction error of the ART2-based DMW is slightly larger than that of the WED-based DMW at sample #126.

As shown in FIG. 6A to FIG. 6C, the value of Lamp Illumination at sample #126 is quite different from those of the modeling samples of the SMW scheme, and is relatively similar with samples #35 and #36 kept in the modeling sets of the ART2-based DMW scheme, and is highly similar with sample #30 kept in the modeling sets of the WED-based DMW scheme. Consequently, the phenomena depicted in FIG. 6A to FIG. 6C support the results shown in Table 2 and FIG. 5A and FIG. 5B.

TABLE 2

| | NN | | | | | | MR | | | | | |
|---|---|---|---|---|---|---|---|---|---|---|---|---|
| | MAPE (%) | | | Max Error (%) | | | MAPE (%) | | | Max Error (%) | | |
| Pos. | SMW | DMW-ART2 | DMW-WED | SMW | DMW-ART2 | DMW-WED | SMW | DMW-ART2 | DMW-WED | SMW | DMW-ART2 | DMW-WED |
| 1 | 0.90 | 0.77 | 0.73 | 3.38 | 2.28 | 2.15 | 0.83 | 0.78 | 0.65 | 4.18 | 2.46 | 2.12 |
| 2 | 0.35 | 0.37 | 0.33 | 2.12 | 1.09 | 1.04 | 0.38 | 0.38 | 0.41 | 2.58 | 1.08 | 1.14 |
| 3 | 0.70 | 0.67 | 0.67 | 3.32 | 1.92 | 1.70 | 0.72 | 0.66 | 0.70 | 3.90 | 1.85 | 1.76 |
| 4 | 0.59 | 0.55 | 0.56 | 2.13 | 1.99 | 1.82 | 0.66 | 0.60 | 0.62 | 2.20 | 1.98 | 1.85 |
| 5 | 0.51 | 0.58 | 0.53 | 1.45 | 1.59 | 1.66 | 0.57 | 0.62 | 0.63 | 1.42 | 1.81 | 1.44 |
| 6 | 0.59 | 0.57 | 0.56 | 1.92 | 1.63 | 1.48 | 0.64 | 0.60 | 0.60 | 2.32 | 1.83 | 1.55 |
| 7 | 0.55 | 0.52 | 0.55 | 1.56 | 1.68 | 1.52 | 0.58 | 0.55 | 0.54 | 1.82 | 1.38 | 1.50 |
| 8 | 0.92 | 0.87 | 0.75 | 2.54 | 2.42 | 2.45 | 0.90 | 0.87 | 0.79 | 3.58 | 2.37 | 2.50 |
| Mean | 0.64 | 0.61 | 0.58 | 2.30 | 1.83 | 1.73 | 0.66 | 0.63 | 0.62 | 2.75 | 1.84 | 1.73 |

With the initial model-creation window size being 75 samples (i.e. 75 sets of sample data), the numbers of groups of the ART2-based DMW and WED-based DMW schemes in Examples 1 and 2 are 40 and 7, respectively. The number of groups should not be close to that of the model-creation window size (75), otherwise the number of elements in each group will be relatively small. All the elements in the same group sorted by ART2 have the same properties. To sustain the properties of each group, the minimal number of elements is three (3). Therefore, the predetermined number in step 170 of FIG. 1 is three, i.e. when the number of samples in one group is greater than or equal to 3, the oldest sample is this group can be discarded without affecting the properties of this group; when the number of samples in one group is smaller than or equal to 3, all the samples is this group has to be reserved (kept) or the properties of this group cannot be sustained.

The method shown in the aforementioned embodiments for screening samples for building a prediction model can be a computer-implemented method, and can be provided as a computer program product, which may include a machine-readable medium on which instructions are stored for programming a computer (or other electronic devices) to perform a process based on the embodiments of the present invention. The machine-readable medium can be, but is not limited to, a floppy diskette, an optical disk, a compact disk-read-only memory (CD-ROM), a magneto-optical disk, a read-only memory (ROM), a random access memory (RAM), an erasable programmable read-only memory (EPROM), an electrically erasable programmable read-only memory (EEPROM), a magnetic or optical card, a flash memory, or another type of media/machine-readable medium suitable for storing electronic instructions. Moreover, the embodiments of the present invention also can be downloaded as a computer program product, which may be transferred from a remote computer to a requesting computer by using data signals via a communication link (such as a network connection or the like).

It can be known from the above that, with the application of the embodiments of the present invention, a forecast scheme of WIP output timing and quantities for simultaneously processing paired and unpaired WIP data can be effectively built, thus achieving the purpose of commonly using a forecasting method for both types of WIP data.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A computer implemented method for screening samples for building a prediction model, comprising:
   obtaining a plurality of sets of first sample data sequentially generated with respect to a target to be predicted, the sets of first sample data comprising:
      a plurality of sets of monitored data; and
      a plurality of objective data, wherein the objective data are corresponding to the sets of monitored data in a one-to-one manner and are cause-and-result related;
   performing a clustering step with respect to all of the sets of first sample data for grouping the sets of first sample data with high similarities as one group, thereby forming and obtaining a plurality of first groups;
   searching for at least one of the first groups having the most number of sets of first sample data, thereby obtaining at least one second group;
   determining if the number of the at least one second group is greater than or equal to 2, thus obtaining a first determination result;
   searching for one of the at least one second group having the oldest set of first sample data when the first determination result is yes, thereby obtaining a third group; and determining if the number of sets of first data in the third group is smaller than a predetermined number, thus obtaining a second determination result;
   determining if the number of sets of first data in the second group is smaller than the predetermined number when the first determination result is no, thus obtaining a third determination result;
   reserving all of the sets of first sample data for building or refreshing the prediction model when the second determination result or the third determination result is yes, wherein the prediction model is used for predicting a status or behavior of the target;
   discarding the oldest set of first sample data in the third group and reserving the remaining sets of first sample data for building or refreshing the prediction model when the second determination result is no; and
   discarding the oldest set of first sample data in the second group and reserving the remaining sets of first sample data for building or refreshing the prediction model when the third determination result is no.

2. The method as claimed in claim 1, wherein the sets of first sample data comprise:
   a plurality of sets of historical sample data stored in a database; and
   a set of newly-collected sample data.

3. The method as claimed in claim 1, wherein the sets of first sample data are obtained via a moving window.

4. The method as claimed in claim 1, wherein the target to be predicted is a workpiece processed by a process tool, and the prediction model is a virtual metrology model, wherein
   the sets of monitored data are a plurality of sets of process data which are generated while a plurality of historical workpieces are processed in the process tool, each of the sets of process data comprising a plurality of process parameters; and
   the objective data are a plurality of metrology data which are obtained by using a metrology tool to measure the historical workpieces, wherein the metrology data are corresponding to the sets of process data in a one-to-one manner.

5. The method as claimed in claim 1, wherein the clustering step is performed in accordance with an adaptive resonance theory 2 (ART2) algorithm.

6. The method as claimed in claim 1, wherein the clustering step is performed in accordance with a Euclidean distance (ED) algorithm.

7. The method as claimed in claim 1, wherein the clustering step is performed in accordance with a weighted Euclidean Distance (WED) algorithm.

8. The method as claimed in claim 1, wherein the clustering step is performed with respect to the sets of sets of monitored data in the sets of first sample data.

9. The method as claimed in claim 1, wherein the clustering step is performed with respect to the sets of sets of monitored data and the objective data in the sets of first sample data.

10. A computer program product stored on a non-transitory tangible computer readable recording medium, which, when executed, performs a method for screening samples for building a prediction model, the method comprising:
   obtaining a plurality of sets of first sample data sequentially generated with respect to a target to be predicted, the sets of first sample data comprising:
      a plurality of sets of monitored data; and
      a plurality of objective data, wherein the objective data are corresponding to the sets of monitored data in a one-to-one manner and are cause-and-result related;
   performing a clustering step with respect to all of the sets of first sample data for grouping the sets of first sample data with high similarities as one group, thereby forming and obtaining a plurality of first groups;
   searching for at least one of the first groups having the most number of sets of first sample data, thereby obtaining at least one second group;
   determining if the number of the at least one second group is greater than or equal to 2, thus obtaining a first determination result;
   searching for one of the at least one second group having the oldest set of first sample data when the first determination result is yes, thereby obtaining a third group; and determining if the number of sets of first data in the third group is smaller than a predetermined number, thus obtaining a second determination result;

determining if the number of sets of first data in the second group is smaller than the predetermined number when the first determination result is no, thus obtaining a third determination result;

reserving all of the sets of first sample data for building or refreshing the prediction model when the second determination result or the third determination result is yes, wherein the prediction model is used for predicting a status or behavior of the target;

discarding the oldest set of first sample data in the third group and reserving the remaining sets of first sample data for building or refreshing the prediction model when the second determination result is no; and discarding the oldest set of first sample data in the second group and reserving the remaining sets of first sample data for building or refreshing the prediction model when the third determination result is no.

11. The computer program product as claimed in claim 10, wherein the sets of first sample data comprise:

a plurality of sets of historical sample data stored in a database; and a set of newly-collected sample data.

12. The computer program product as claimed in claim 10, wherein the sets of first sample data are obtained via a moving window.

13. The computer program product as claimed in claim 10, wherein the target to be predicted is a workpiece processed by a process tool, and the prediction model is a virtual metrology model, wherein the sets of monitored data are a plurality of sets of process data which are generated while a plurality of historical workpieces are processed in the process tool, each of the sets of process data comprising a plurality of process parameters; and the objective data are a plurality of metrology data which are obtained by using a metrology tool to measure the historical workpieces, wherein the metrology data are corresponding to the sets of process data in a one-to-one manner.

14. The computer program product as claimed in claim 10, wherein the clustering step is performed in accordance with an adaptive resonance theory 2 (ART2) algorithm.

15. The computer program product as claimed in claim 10, wherein the clustering step is performed in accordance with a Euclidean distance (ED) algorithm.

16. The computer program product as claimed in claim 10, wherein the clustering step is performed in accordance with a weighted Euclidean Distance (WED) algorithm.

17. The computer program product as claimed in claim 10, wherein the clustering step is performed with respect to the sets of sets of monitored data in the sets of first sample data.

18. The computer program product as claimed in claim 10, wherein the clustering step is performed with respect to the sets of sets of monitored data and the objective data in the sets of first sample data.

* * * * *